United States Patent
Khosropour et al.

[11] Patent Number: 5,904,489
[45] Date of Patent: May 18, 1999

[54] TOPSIDE ANALYSIS OF A MULTI-LAYER INTEGRATED CIRCUIT DIE MOUNTED IN A FLIP-CHIP PACKAGE

[75] Inventors: Fred Khosropour, San Jose; Ahmad Ghaemmaghami, Morgan Hill, both of Calif.

[73] Assignee: Advanced Micro Devices, Inc., Sunnyvale, Calif.

[21] Appl. No.: 09/122,835

[22] Filed: Jul. 27, 1998

[51] Int. Cl.⁶ .................................................. H01J 37/30
[52] U.S. Cl. ...................... 438/15; 438/109; 438/125; 257/692; 257/693; 257/694
[58] Field of Search ............... 438/15, 109, 125; 257/678, 384, 690, 692, 693, 694, 695, 700, 701

[56] References Cited

U.S. PATENT DOCUMENTS

| | | |
|---|---|---|
| 5,155,067 | 10/1992 | Wood et al. . |
| 5,336,649 | 8/1994 | Kinsman et al. . |
| 5,766,978 | 6/1998 | Johnson . |
| 5,786,701 | 7/1998 | Pedder . |
| 5,789,930 | 8/1998 | Isaacs et al. . |
| 5,801,432 | 9/1998 | Rostoker et al. . |
| 5,807,763 | 9/1998 | Motika et al. . |
| 5,821,549 | 10/1998 | Talbot et al. . |

*Primary Examiner*—Charles Bowers
*Assistant Examiner*—Martin Sulsky

[57] ABSTRACT

Aspects for topside analysis of an integrated circuit die mounted in a flip-chip orientation are described. In an exemplary method aspect, the method includes isolating the multi-layer integrated circuit die from the flip-chip package, and exposing the multilayer integrated circuit die. The method further includes testing selected areas of the multi-layer integrated circuit die from a topside utilizing critical paths placed in a predetermined arrangement around edges of the multi-layer integrated circuit die.

12 Claims, 2 Drawing Sheets

TOPSIDE ANALYSIS OF A MULTI-LAYER INTEGRATED CIRCUIT DIE MOUNTED IN A FLIP-CHIP PACKAGE

FIELD OF THE INVENTION

The present invention relates to multi-layer integrated circuit (IC) devices, and more particularly to multi-layer IC die extraction from a flip-chip package for device testing from a topside.

BACKGROUND OF THE INVENTION

For flip-chip, multi-layer IC devices, debugging for defects in the IC is difficult due to having to approach the desired layers from the backside of the device. FIG. 1 illustrates a sideview block diagram of a typical flip-chip configuration. As shown in FIG. 1, an IC device 10 is coupled to a ceramic package 12 (e.g., a C4 package) via solder bumps 14. The solder bumps 14 act as chip-to-carrier interconnects to attach the IC device 10 to the ceramic package 12 and to mate with corresponding pad patterns to form the necessary electrical contacts between the circuit(s) of the IC device 10 and pins of the package 12.

Testing of the circuit remains a challenge due to the upside-down nature of the flip-chip orientation. While the circuit may be approached through the backside layers, such techniques are usually not preferred due to the difficulties associated with having to access the layers in an unconventional order. Further, these techniques normally reduce the thickness of the device to reach the circuit, making the device extremely fragile and cumbersome to handle and utilize during testing.

Accordingly, a need exists for an efficient procedure for topside analysis of an IC mounted in a flip-chip orientation. The present invention addresses such a need.

SUMMARY OF THE INVENTION

The present invention provides for topside analysis of an IC mounted in a flip-chip orientation. In an exemplary method aspect, the method includes isolating the multi-layer integrated circuit die from the flip-chip package, and exposing the multi-layer integrated circuit die. The method further includes testing selected areas of the multi-layer integrated circuit die from a topside utilizing critical paths placed in a predetermined arrangement around edges of the multi-layer integrated circuit die.

Through the present invention, more efficient device removal for analysis is achieved for flip-chip devices. The present invention utilizes advantageously placed critical paths around edges of the circuit once the die is isolated and extracted from the flip-chip package in a manner that enhances testing of the device from a topside. These and other advantages of the aspects of the present invention will be more fully understood in conjunction with the following detailed description and accompanying drawings.

DETAILED DESCRIPTION

The present invention relates to a procedure for topside analysis of multi-layer integrated circuit flip-chip devices. The following description is presented to enable one of ordinary skill in the art to make and use the invention and is provided in the context of a patent application and its requirements. Various modifications to the preferred embodiment and the generic principles and features described herein will be readily apparent to those skilled in the art.

Figure 1:
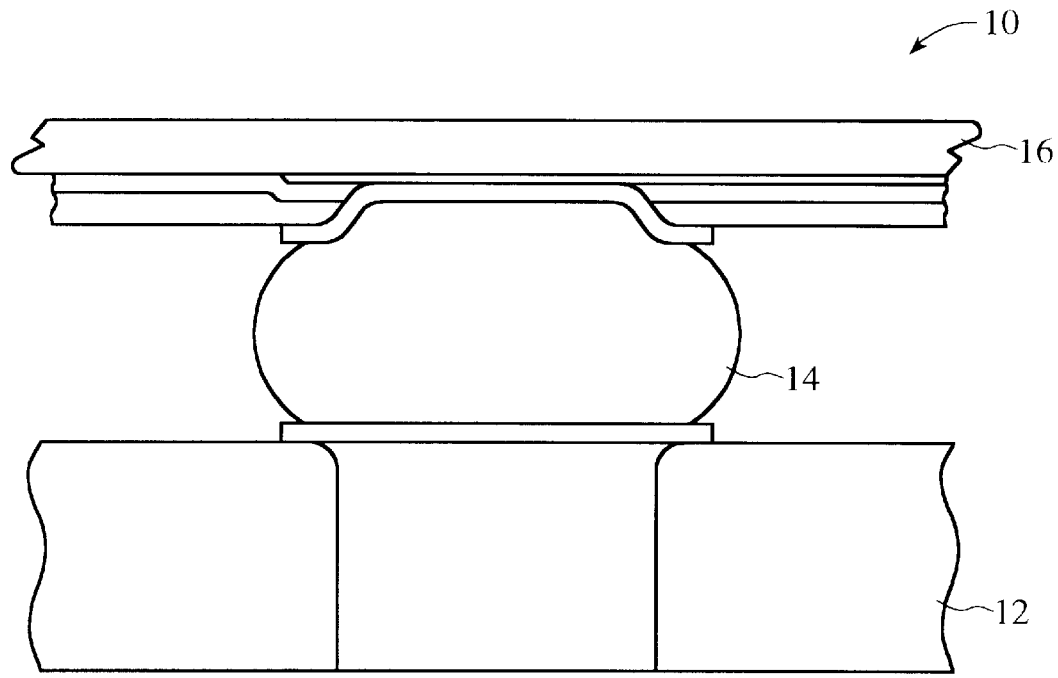
FIG. 1 illustrates a sideview diagram of a typical flip-chip multi-layer integrated circuit.
Figure 2:
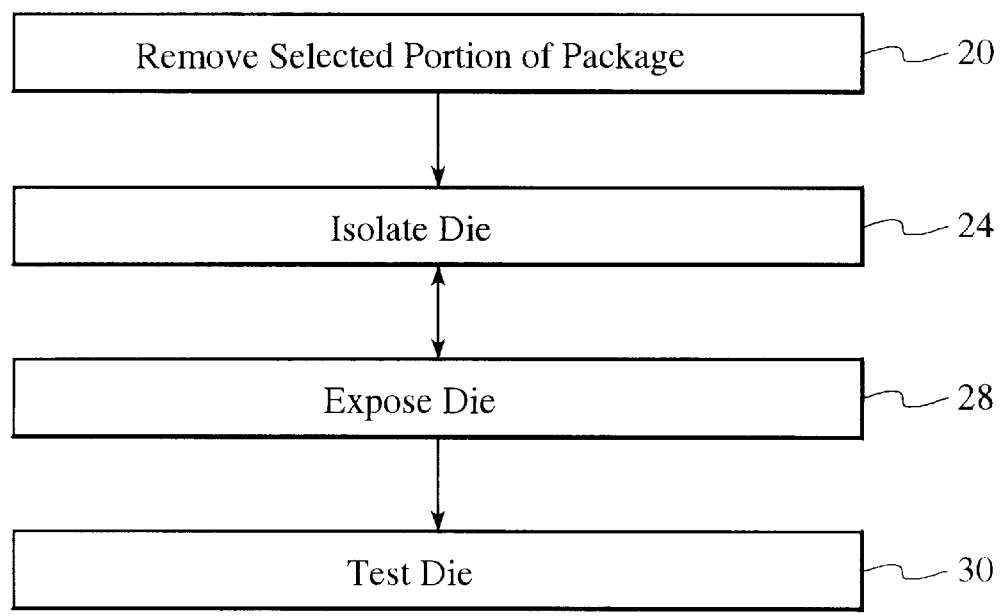
FIG. 2 illustrates a flow diagram of a procedure for topside analysis of a multilayer integrated circuit mounted in a flip-chip orientation in accordance with the present invention.
Figure 3A:
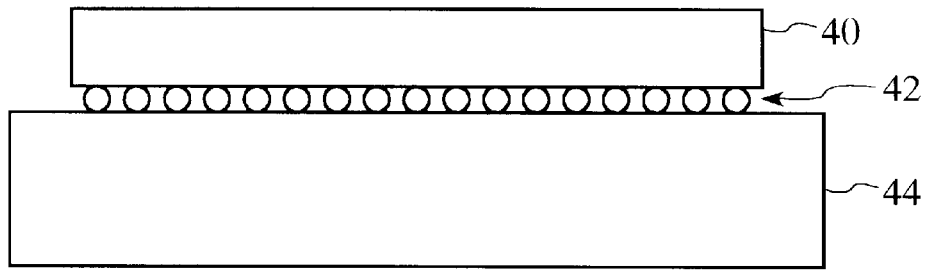
FIGS. 3a, 3b, and 3c illustrate a partial cross-section of the multi-layer integrated circuit die during the procedure illustrated in FIG. 2.

FIG. 2 illustrates a block flow diagram of a process for topside analysis for flip-chip, multi-layer IC devices. The process begins by removing a selected portion of a flip-chip, ceramic package (step 20), e.g., by cutting off the portion of the package outside of the package area attached to the die. FIG. 3a illustrates a partial cross-sectional view of a multi-layer integrated circuit die 40 attached via solder bumps 42 to a flip-chip package 44 with only a selected portion of the package 44 still remaining attached to the die 40 in accordance with step 20.

The die is then suitably isolated from the package (step 24). By way of example, die 40 and package 44 are inserted in a resin, such as EPO-KWICK by Buehler, Inc. Once the resin has hardened, the package 44 and resin material are polished off using mechanical polishing to leave the die 40 covered in resin. The remaining resin is then suitably dissolved off the die using an appropriate solvent. Alternatively, the die 40 is isolated by heating to a predetermined temperature for a predetermined time period, e.g., using a hot plate and heating to about 300° C. for about two minutes. The die 40 is then isolated by removing the die form the package, such as with a razor blade.

Figure 3B:
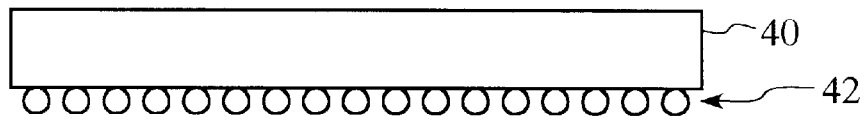

With the die isolated, as shown in FIG. 3b, exposure of the die proceeds by removal of the solder bumps and a protective layer of polyimide on the die (step 28). Removal of the solder bumps suitably occurs using a series of acid solution dips. By way of example, a five minute dip in acetic acid:$H_2O_2$, followed by a one and one-half minute dip in acetic acid:nitric acid:hydrofluoric acid, and then a two minute dip in chromium is a suitable sequence. RIE (reactive ion etching) techniques for removing polyimide capably etch the polyimide layer.

Figure 3C:
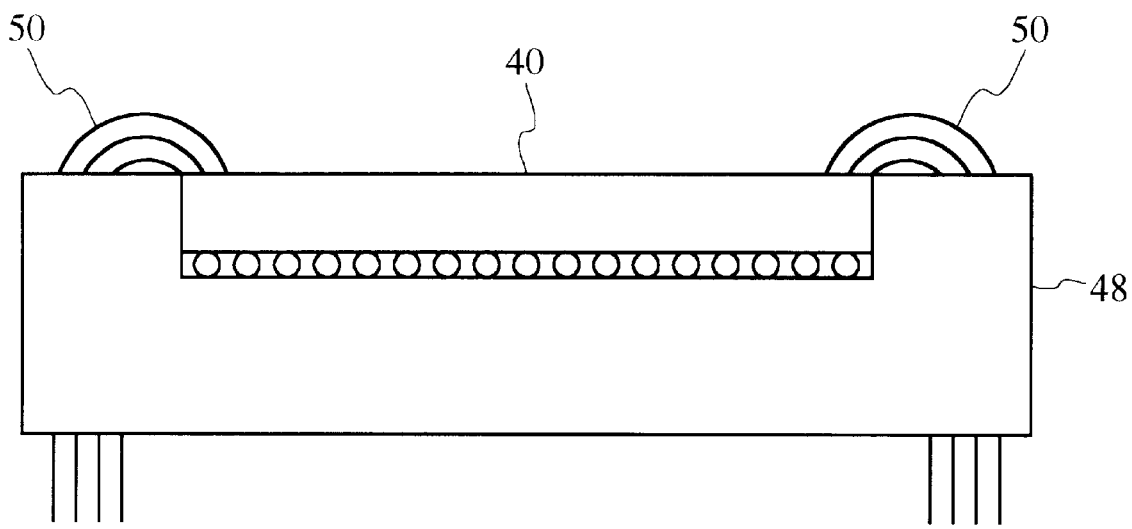

With the die exposed by removal of the solder bumps and protective polyimide, testing of the die then occurs utilizing critical paths positioned in a predetermined manner (step 30). In a preferred embodiment, the die is packaged into a standard PGA (pin gate array) package from the topside. Desired pads are then bonded out using conventional techniques for electrical testing of desired critical signals in the critical paths, the critical paths advantageously placed near the edges of the integrated circuit die. FIG. 3c illustrates a cross-section of the die 40 packaged in a PGA package 48 with bonding wires 50 for electrical testing. As illustrated, the bonding wires exist around the edge of the die 40, since the critical paths have been placed near the edge of the die, rather than throughout the die, as is standardly done. Electrical nodes may then be brought up to probe using electron beam (e-beam) testing, as is well understood by those skilled in the art.

Although the present invention has been described in accordance with the embodiments shown, one of ordinary skill in the art will recognize that there could be variations to the embodiment and those variations would be within the spirit and scope of the present invention. Accordingly, many modifications may be made by one of ordinary skill without departing from the spirit and scope of the present invention, the scope of which is defined by the following claims.

What is claimed is:

1. A method for topside analysis of a multi-layer integrated circuit die mounted in a flip-chip package, the method comprising the sequential steps of:

isolating the multi-layer integrated circuit die from the flip-chip package;

exposing the multi-layer integrated circuit die; and testing selected areas of the multi-layer integrated circuit die from a topside utilizing critical paths placed in a predetermined arrangement around edges of the multi-layer integrated circuit die.

2. The method of claim 1 wherein isolating further comprises removing a selected portion of the flip-chip package, and coating a remaining portion of the flip-chip package and the multi-layer integrated circuit die in resin.

3. The method of claim 2 further comprising allowing the resin to harden, and polishing off the resin and remaining portion of the flip-chip package to isolate the multi-layer integrated circuit die in the resin.

4. The method of claim 3 further comprising extracting the multi-layer integrated circuit die from the resin by dissolving the resin in a solvent.

5. The method of claim 4 wherein exposing the multi-layer integrated circuit die further comprises removing solder bumps and a polyimide layer from the multi-layer integrated circuit die.

6. The method of claim 5 wherein testing selected areas further comprises packaging the multi-layer integrated circuit die into a pin gate array package, and bonding out one or more electrical nodes to testing pads for probing.

7. The method of claim 1 wherein isolating further comprises removing a selected portion of the flip-chip package, heating the multi-layer integrated circuit die and remaining portion of the flip-chip package to a predetermined temperature for a predetermined time period to allow removal of the multi-layer integrated circuit die from the flip-chip package.

8. A method for topside analysis of a multi-layer integrated circuit die mounted in a flip-chip package, the method comprising the sequential steps of:

removing a selected portion of the flip-chip package;

isolating the multi-layer integrated circuit die from the flip-chip package;

removing a protective layer and chip-to-carrier interconnect material from the multi-layer integrated circuit die; and testing the multi-layer integrated circuit die from a topside of the multi-layer integrated circuit die at desired critical paths placed around the edges of the multi-layer integrated circuit die.

9. The method of claim 8 wherein isolating further comprises coating a remaining portion of the flip-chip package and the multi-layer integrated circuit die in resin, polishing off the remaining portion of the flip-chip package with hardened resin, and dissolving the resin on the multi-layer integrated circuit die in a solvent to allow extraction of the multi-layer integrated circuit die.

10. The method of claim 8 wherein testing further comprises packaging the multilayer integrated circuit die in a pin gate array package from the topside, bonding out desired pads for testing, and electrically probing the desired pads.

11. The method of claim 8 wherein the protective layer further comprises a polyimide layer.

12. The method of claim 8 wherein the chip-to-carrier interconnect material further comprises solder bumps.

* * * * *